United States Patent [19]

Cagan et al.

[11] Patent Number: 5,045,918
[45] Date of Patent: Sep. 3, 1991

[54] SEMICONDUCTOR DEVICE WITH REDUCED PACKAGING STRESS

[75] Inventors: Myron R. Cagan; Douglas F. Ridley; Daniel J. Belton, all of San Jose, Calif.

[73] Assignee: North American Philips Corp., New York, N.Y.

[21] Appl. No.: 504,710

[22] Filed: Apr. 4, 1990

Related U.S. Application Data

[63] Continuation of Ser. No. 944,268, Dec. 19, 1986, abandoned.

[51] Int. Cl.$^5$ .................... H01L 23/28; H01L 29/34
[52] U.S. Cl. ........................... 357/72; 357/54
[58] Field of Search ....................... 357/54, 72

[56] References Cited

U.S. PATENT DOCUMENTS

| | | | |
|---|---|---|---|
| 3,694,707 | 9/1972 | Nakamura et al. | 357/72 |
| 4,279,717 | 7/1981 | Eckberg et al. | |
| 4,328,262 | 5/1982 | Kurahashi et al. | 357/54 |
| 4,426,657 | 1/1984 | Abiru et al. | 357/72 |
| 4,499,149 | 2/1985 | Berger | 357/8 |
| 4,504,631 | 3/1985 | Doi et al. | 430/280 |
| 4,636,454 | 1/1987 | Fujimoto et al. | 430/287 |
| 4,853,761 | 8/1989 | Ikeda | 357/72 |

FOREIGN PATENT DOCUMENTS

| | | |
|---|---|---|
| 0260360 | 3/1988 | European Pat. Off. |
| 52-40067 | 3/1977 | Japan ............... 357/72 |
| 54-23470 | 2/1979 | Japan ............... 357/72 |
| 56-24956 | 10/1981 | Japan ............... 357/72 |
| 57-76869 | 5/1982 | Japan ............... 357/72 |
| 58-107657 | of 1983 | Japan ............... 357/72 |
| 58-43545 | 3/1983 | Japan ............... 357/72 |
| 58-93359 | 6/1983 | Japan ............... 357/72 |
| 58-166748 | 10/1983 | Japan ............... 357/72 |
| 61-102758 | 5/1986 | Japan . |
| 61-194758 | 8/1986 | Japan ............... 357/72 |
| 62-168944 | 9/1986 | Japan . |

OTHER PUBLICATIONS

Dennis et al, "Elastomer Protects Communication Fibers," *R & D,* Jan. 1986, pp. 70–71.
Sasaki et al, "The Development of Mini Plastic IC Packaging for Dip Soldering," *Proceedings 34th Ele. Components Conf.,* 14–16 May 1984, pp. 383–384.
Antonen et al, "Silicone Coatings for IC Protection," *Microelectronic Mfg. & Testing,* Apr. 1985, 3 pages.
Kookootsedes et al, "Specialty Silicone Elastomers Cope with Diverse Hybrid Circuit Applications," *Hybrid Circuit Tech.,* 9/1985.
Kookootsedes et al, "Selecting Protective Materials for Coating Hybrid Circuits," *Hybrid Circuit Tech.,* Mar. 1986, 4 pages.
Rosen, *Fundamental Principles of Polymeric Materials* (John Wiley & Sons: 1982), Chap. 8, pp. 88 et seq.

Primary Examiner—J. Carroll
Attorney, Agent, or Firm—A. Tamoshunas; R. Meetin

[57] ABSTRACT

A semiconductor device contains a stress-relief layer (46) having a glass transition temperature of 25° C. or less. The layer generally lies above an electrical interconnection system (12) in the device but does not overlie bond pad areas. This substantially alleviates thermally induced stress that could otherwise damage electronic components in the device while simultaneously allowing the maximum stress on electrical conductors (32 and 34) that protrude from the external package coating (48) to occur at bonding areas which can tolerate the stress. The layer preferably is a silicone polymer consisting of exposed photosensitive material.

24 Claims, 3 Drawing Sheets

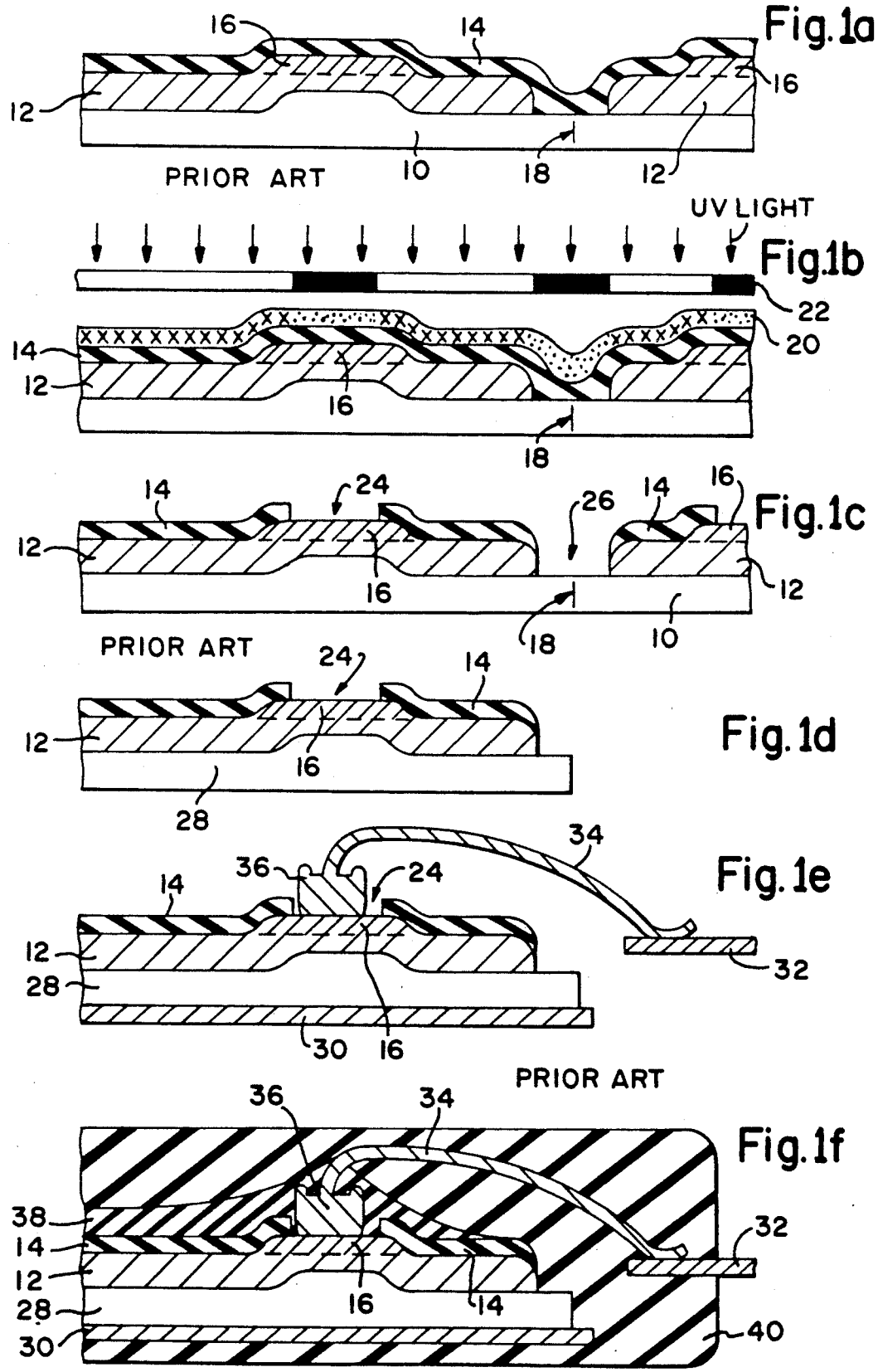

SEMICONDUCTOR DEVICE WITH REDUCED PACKAGING STRESS

CROSS REFERENCE TO RELATED APPLICATION

This is a continuation of U.S. patent application Ser. No. 944,268, filed December 19, 1986, now abandoned.

FIELD OF USE

This invention relates to semiconductor devices that utilize a mechanism to reduce mechanical packaging stress. The invention also relates to methods for fabricating such devices.

BACKGROUND ART

The microelectronic components in a semiconductor device such as an integrated circuit (IC) or a discrete device can easily be damaged by forces in the harsh external world. Some sort of packaging material is normally placed around the electronic components to protect them from the outside environment. The packaging material must, however, be situated on the device in such a way that the material does not in itself cause the components to fail.

Some of the problems that arise in placement of the packaging material can be understood with reference to FIGS. 1a–1f which illustrate the final stages in the fabrication, including the packaging, of a group of conventional IC's. The starting point for making th IC's is a semiconductor wafer containing a number of dice.

At the stage indicated in FIG. 1a, the wafer consists of a monocrystaline silicon semiconductive substrate 10, a group of electrical interconnection systems 12, on for each die, and an electrically insulating layer 14 of a passivating material such as phosphosilicate glass or silicon nitride. Various N-type and P-type regions (not shown in the drawings) exist in substrate 10. Each interconnection system 12 consists of a set of electrical lines and insulators formed on substrate 10. The lines are selectively connected to the N-type and P-type regions. Items 16 in systems 12 are the metallic bond pads, typically consisting of an aluminum alloy, through which the dice electrically communicate with the outside world. Insulating layer 14 overlies systems 12 and extends down to substrate 10 at the intended locations 18 for the side boundaries of the portions of substrate 10 used in the various IC's. More particularly, locations 18 which laterally circumscribe each system 12, are the places where the wafer is later cut into separate dice.

Before going further, a comment needs to be made about lithographic terminology. Material is "actinic" if it can be formed into a lithographic pattern by selectively exposing portions of a layer of the material to radiation that couses the exposed portions to change their chemical structure and subsequently developing the layer to remove either the exposed portions or the unexposed portions. Actinic material such as photoresist is negative "tone" when the exposed portions (of changed chemical structure) remain after development. The "tone" is positive if the unexposed portions remain after development.

Turning back to FIGS. 1a–1f, a blanket masking layer 20 of photoresist is formed on layer 14 as shown in FIG. 1b. Photoresist layer 250 is selectively exposed to ultraviolet (UV) light through a radiation mask 22. If, for example, the tone of the photoresist is negative, mask 22 has opaque areas that prevent UV light from impinging on parts of layer 20 lying above bond pads 16 and locations 18. After developing layer 20 to remove the unexposed photoresist, layer 14 is etched through the resulting apertures in layer 20 to form bond pad openings 24 and scribe line openings 26 that respectively extend down to pads 16 and locations 18. The remaining photoresist is removed to produce the structure depicted in FIG. 1c.

Next, substrate 10 is scribed along locations 18 to break the wafer into the separate dice, one for each IC. FIG. 1d illustrates one of the resulting dice. The portion of substrate 10 used in the die of FIG. 1d is indicated as semiconductive body 28.

Concentrating on this particular die, body 28 is mounted on the central section 30 of a metallic lead frame having a set of leads 32 separate from section 30. See FIG. 1e. Leads 30 are connected respectively to pads 16 by way of gold wires 34. The combination of leads 32 and wires 34 forms a set of electrical conductors that connect system 12 with the external world. At the place where each wire 34 is bonded to its pad 16 in its opening 24, wire 34 spreads out into a deformed "ball" 36.

The die can now be packaged in various ways. In one packaging technique investigated in the prior art, a small amount of a liquid such as a silicone is deposited on top of the die and then suitably treated to form an electrically insulating elastomeric (or rubbery) layer 38. See FIG. 1f. Layer 38 typically has a glass transition temperature of about −100° C. Portions of elastomeric layer 38 normally "wick up" slightly over balls 36. The resulting structure is encapsulated with a package coating 40 of a hard electrically insulating material in such a way that only a part of each lead 32 protrudes through coating 40.

Coating 40 typically consists of an epoxy or other thermosetting resin molded around the die and lead frame at an elevated temperature. During the subsequent cooldown to room temperature, coating 40 shrinks much more than the die and lead frame. Layer 38 relieves much of the severe mechanical stress that would otherwise be placed on body 28 and interconnection system 12 as a result of the cooldown shrinkage.

The IC is now subjected to accelerated life tests to assess how it will perform. The tests typically entail cycling the IC rapidly between the industry-standard limits of −65° C. and 150° C. in both an air environment and a liquid environment.

A major difficulty with the IC of FIG. 1f centers around the part of each wire 34 where the top of layer 38 adjoins coating 40 just above associated ball 36. During the life tests, this part of wire 34 often breaks after a small number of thermal cycles, resulting in IC failure. The breakage mechanism appears to be fatigue produced by large differential thermal expansions/contractions in the IC that cause the portion of wire 34 in coating 40 to be shifted back and forth relative to the portion of wire 34 in layer 38.

Eliminating stress-relief layer 38 shifts the area of high stress down to balls 36. Because the area of each ball 36 where it contacts its pad 16 is much greater, typically at least four times greater, than the cross-sectional area of the remainder of its wire 34, ball 36 rarely breaks if layer 38 is absent. At the worst, ball 36 moves slightly. This is usually not catastrophic since ball 36 normally remains in contact with pad 16. However, the electronic components in interconnection system 28 and substrate 12 are now subjected to high stress during the thermal cycling and can fail unduly rapidly. It would be desirable to have a mechanism that avoids placing substantial stress on system 28 and substrate 12 without causing wires 34 to break.

GENERAL DISCLOSURE OF THE INVENTION

The present invention provides such a mechanism in the form of a stress-relief layer located in selected regions inside a packaged semiconductor device and having a glass transition temperature below 150° C. The stress-relief layer generally lies above an interconnect system in the device but does not lie above bond pad areas where bonding connections are made to the interconnect system. By virtue of this arrangement, the layer substantially alleviates thermally induced mechanical stress that would otherwise be placed on electronic components in the device while simultaneously allowing the maximum stress on electrical conductors that protrude from the device to occur at bonding areas which can tolerate the stress. The result is a significant improvement in IC lifetime.

More particularly, the invention entails a semiconductor device in which an insulating layer lies on an interconnection system contacting a semiconductive body. Openings extend through the insulating layer down to bond pads of the interconnection system. Each pad is in contact with a bonding portion, typically a deformed "ball", of one of a set of electrical conductors that lead through the openings away from the interconnection system. An insulating coating of a packaging material covers the body, the interconnection system, and the bonding portions in such a manner that only a part of each conductor protrudes through the coating.

A further layer lies on the insulating layer under the package coating but does not extend over the bonding portions. The further layer consists of an insulating material, preferably a transparent polymer, that has a glass transition temperature $T_G$ below 150° C. $T_G$ is preferably 25° C. or less. The further layer is therefore elastomeric over a temperature range starting at a temperature below 150° C. and extending above 150° C. until decomposition occurs.

We believe that a significant portion of the volumetric expansion/contraction that causes stress in the device during thermal cycling between 150° C. and a lower temperature (e.g., −65° C. as in industry-standard life tests) normally occurs near 150° C. Consequently, the further layer alleviates stress across a portion of the temperature cycling range where stress relief is needed most. If, as we also believe, significant stress is developed during excursions to low temperatures, reducing $T_G$ provides more stress relief.

In one method of fabricating the present device starting with a structure in which the openings have been etched through the insulating layer, a patternable layer is formed on the insulating layer and in the openings. the patternable layer preferably consists of actinic material.

Selected portions of the patternable layer are removed down to the pads. If the patternable layer is actinic, the removal step usually involves exposing portions of the patternable layer to radiation that causes the exposed portions to change their chemical structure and then developing the patternable layer to remove the selected portions. In any case, the remainder of the patternable layer forms the stress-relief layer. Next, the structure is provided with the electrical conductors that lead from the pads through the openings away from the interconnection system. The device is completed by covering the body, the interconnection system, and the layers with the package coating.

Alternatively, the patternable layer can be formed on the insulating layer before the openings are etched through it. In this case, selected portions of the patternable layer above the bond pads are removed after which underlying portions of the insulating layer are removed to expose the pads. The device is then finished in the way specified above. While the alternative method saves a masking step, it is more difficult to implement effectively if the material of the stress-relief layer is not well suited for use as an etching mask.

BRIEF DESCRIPTION OF THE DRAWINGS

FIGS. 1a, 1b, 1c, 1d, 1e, and 1f are cross-sectional structural views illustrating steps in a prior art IC manufacturing process. FIGS. 1a–1c show part of a full wafer, while FIGS. 1d–1f specialize to one of the dice.

FIGS. 2a–2c show part of a full wafer. FIGS. 2d–2f specialize to one of the dice of the invention.

Like reference symbols are employed in the drawings and in the description of the preferred embodiments to represent the same or very similar item or items.

Figure 2A:
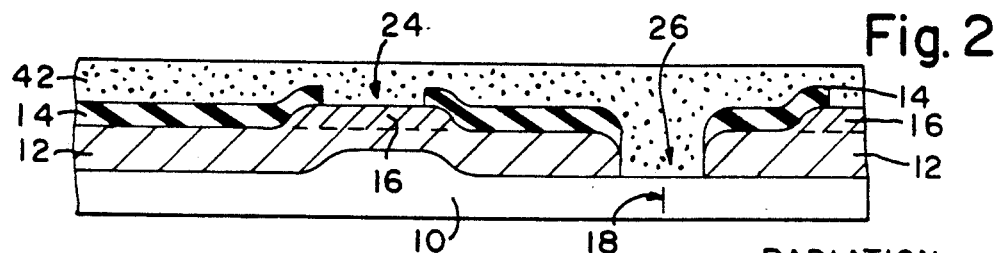
FIGS. 2a, 2b, 2c, 2d, 2e, and 2f are cross-sectional structural views illustrating steps in an IC manufacturing process according to the invention starting from the structure of FIG. 1c.

The following convention is employed for actinic material in the drawings. During and after exposure to suitable actinic radiation, crossed shading (X's) denotes actinic material that remains after development. During exposure, dotted shading represents actinic material that is removed during development. Because the drawings illustrate actinic material of negative tone, dotted shading is used for actinic material prior to exposure. Also, crossed shading is utilized for stress-relief material that is not actinic.

the light parts of the radiation masks shown in the drawings are the areas through which actinic radiation can pass. The dark parts of the radiation masks are the areas that block actinic radiation.

DESCRIPTION OF THE PREFERRED EMBODIMENTS

The present invention centers on a particular use of stress-relief material having certain elastomeric characteristics. The temperature at which a material changes from a flexible, elastomeric state to a brittle, glassy state is termed the glass transition temperature. The material is glassy below the glass transition temperature. Above it, the material is elastomeric until the temperature goes so high that the material decomposes. Although the transition from an elastomeric phase to a glassy phase occurs over a temperature range, a material can normally be assigned a relatively precise glass transition temperature by utilizing appropriate extrapolation techniques. For more details, see Rosen, Fundamental Principles of Polymeric Materials (John Wiley & Sons: 1982), chap. 8, pp. 88 et seq.

Referring to the drawings, FIGS. 2a–2f illustrate stages in a preferred method for completing the fabrication of a group of packaged IC's having stress relief in accordance with the invention. The starting point for FIGS. 2a–2f is FIG. 1c in which the wafer has been processed through the selective etching of insulating layer 14 to form bond pad openings 24 and scribe line openings 26. The thickness of layer 14 is preferably 0.7 micron if it consists of silicon nitride or 1 micron if it consists of phosphosilicate glass. Openings 24 are generally square about 125 microns along a side. Openings 24 are generally square about 125 microns along a side. Openings 26 are grooves having a width of about 100 microns.

A patternable blanket layer 42 of an electrically insulating actinic material is formed on layer 14 and in openings 24 and 26 down to pads 16 and substrate 10 as depicted in FIG. 2a. The actinic material is of such a nature that, after further processing, the remainder of layer 42 has the stress-relief characteristics given below. Also, layer 42 is preferably transparent and remains so after further processing. This facilitates subsequent inspection of the wafer and the resulting dice.

Figure 2B:
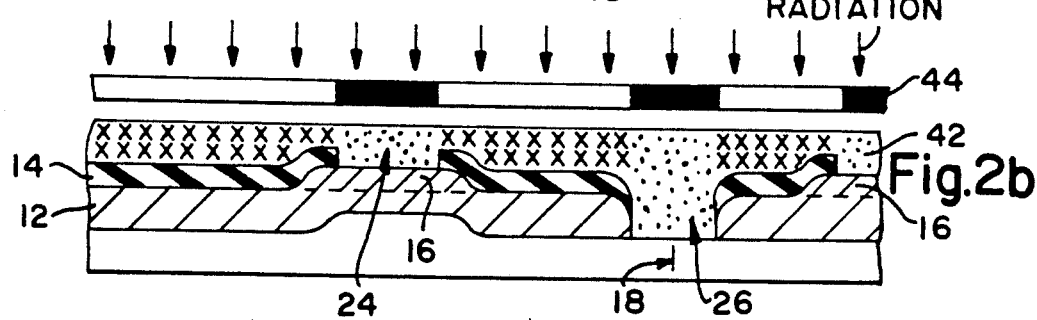

Layer 42 is now selectively exposed to appropriate actinic radiation through a radiation mask 44 as depicted in FIG. 2b. The radiation can take various forms such as UV light, X rays, and electrons depending on the characteristics of the actinic material. The material in layer 42 is, for example, negative tone. In this case, mask 44 has blocking areas that prevent the radiation from impinging on the portions of layer 42 lying on pads 16 and on substrate 10 at intended side boundary locations 18.

Figure 2C:
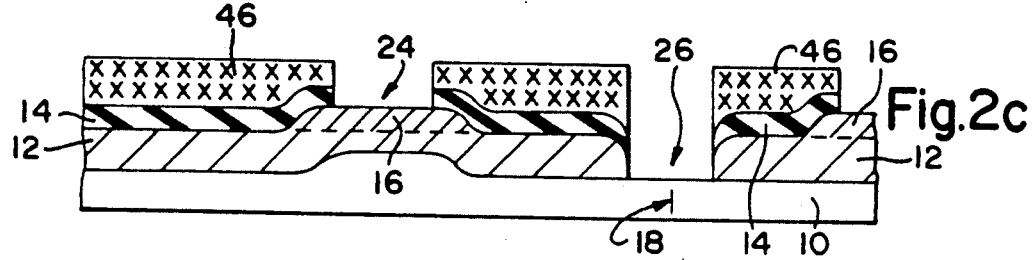

Utilizing a suitable developer, layer 42 is developed to remove the unexposed portions down to pads 16 and substrate 10 at locations 18. Items 46 in FIG. 2c are the electrically insulating portions of layer 42 remaining after exposure and development. Portions 46 generally overlie (the remainder of) layer 14 but largely do not extend into openings 24 and 26.

The thermal expansion coefficient $\alpha_{RES}$ of the thermosetting resin later used to package each die normally increases slowly with increasing temperature until a temperature $T_C$ slightly under 150° C. is reached at which $\alpha_{RES}$ starts to increase sharply. $T_C$ is typically about 130° C. The thermal expansion coefficients, collectively referred to as $\alpha_{OTH}$ here, for the other relevant IC components usually increase slowly with temperature up through 150° C. Below $T_C$, $\alpha_{RES}$ is considerably greater than $\alpha_{OTH}$. However, as the temperature rises above $T_C$, $\alpha_{TES}$ rapidly becomes very much greater than $\alpha_{OTH}$. It thus appears that a large part of the mechanical stress produced in the finished IC's during standard thermal cycling life tests between −65° C. and 150° C. is caused by the differential volumetric expansions/contractions that occur during the transitions between $T_C$ and 150° C. Accordingly, the glass transition temperature of the material in portions 46 is below 150° C. so as to relieve stress in th IC's.

The amount of stress relief appears to increase as $T_G$ decreases. If $T_G$ is less than $T_C$, a substantial amount of stress is alleviated since portions 46 are elastomeric over the $T_C$-to-150° C. portion of the standard thermal cycling range (as well as the $T_G$-to-$T_C$ portion). For IC's used in room-temperature applications, this is safely achieved by arranging for $T_G$ to be 25° C. or less. A value of 25° C. or less for $T_G$ assures that portions 46 are rubbery over the entire temperature range that such IC's experience during operation.

Largely the maximum amount of stress relief is achieved during the standard thermal life tests if $T_C$ is −65° C. or lower. Such a $T_G$ value is desirable for IC's used in very cold environments.

The maximum temperature that the dice experience during the subsequent processing steps described below is normally 275° C. -300° C. The temperature during normal IC operation rarely, if ever, goes above this. Consequently, portions 46 should not significantly decompose at or below 300° C.

In the preferred embodiment, the material of layer 42 in FIG. 2b is a photosensitive negative-tone transparent viscous rom-temperature liquid of the type described in U.S. Pat. No. 4,279,717. The liquid is a combination of experimental materials GE 479-1866 and GE 479-1350C supplied by General Electric Co. The proportions are preferably 90 parts by weight of GE 479-1866 to 10 parts by weight of GE 479-1350C. Exposure to UV light converts the liquid into a silicone polymer.

Layer 42 is formed to an average thickness of 3–5 microns by depositing a specified amount of the liquid on the upper surface of the structure of FIG. 1c and then spinning the resultant structure to p roduce a relatively flat upper surface. No bake step is required. The selective exposure of layer 42 is performed with UV light at a dosage ranging from 0.2 to 2 joules/cm$_2$. The development of layer 42 is done with n-hexane for 20 to 60 seconds.

$T_G$ for the resulting material of portions 46 in FIG. 2c is about −100° C. Decomposition does not begin until the temperature is 350° C. -400° C.

In the present example, layer 42 and photoresist layer 20 used in forming openings 24 and 26 (as shown in FIG. 1b) are of the same tone —negative in this case. Since portions 46 are generally in vertical alignment with the remaining portions of insulator 14, the areas of mask 44 through which the actinic radiation passes are located in the same respective places as the areas of mask 22 through which the UV light passes. If the material that forms the radiation-blocking pattern in mask 44 is (or can be) the same as the material that blocks UV light in mask 22, masks 44 and 22 can be the same or substantially identical radiation masks. This is also true if both of layers 42 and 20 are positive tone. The only difference is that the locations of the blocking and transmitting mask areas are reversed from those indicated in FIGS. 1b and 2b.

Due to the inherent error in aligning masks 44 and 22 to the wafer, parts of layers 46 normally occupy small sections of openings 24 and 26 along their side edges. (This is not illustrated in the drawings.) Should the partial filling of openings 24 and 26 with material of portions 46 be intolerable, the radiation-blocking areas in mask 44 can be made slightly larger than htose in mask 22 if the material in layer 42 is negative tone. The reverse applies if the tone of the material in layer 42 is positive.

Layers 42 and 20 may be of opposite tone. Masks 44 and 22 then must invariably be different.

Figure 2D:
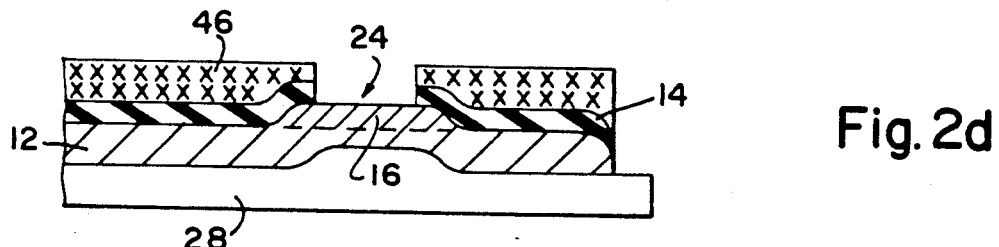

Returning to the general processing sequence, the wafer is broken into separate dice in the way described above for FIG. 1d. One of the resulting die is shown in FIG. 2d. Portion 46 for this die is a continuous layer perforated by openings that merge into openings 24.

The portion of substrate 10 used in the die of FIG. 2d is again indicated as body 28.

Figure 2E:
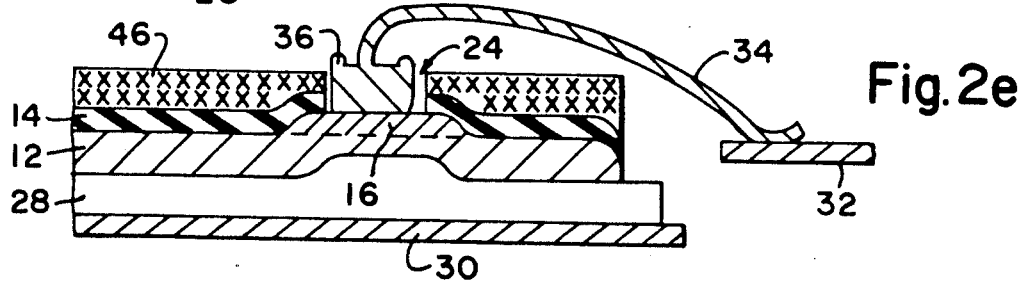

Likewise, the die is provided with a metallic lead frame and intermediate wires 34 in the manner described for FIG. 1e. The process of attaching the die to the lead frame may be done at a temperature as high as 280° C. The wire diameter is preferably 25-35 microns. As indicated in FIG. 2e, the tops of balls 36 normally extend above the top of layer 46.

The IC is now packaged conventionally. The die, lead frame, and composite conductors 32 and 34 are encapsulated in a hard electrically insulating coating 48 such that only parts of leads 32 protrude through coating 48. See FIG. 2f. Package coating 48 consists, for example, of a thermosetting resin such as epoxy cresol novolac hardened with phenol formaldehyde novolac. $T_C$ for this resin is about 130° C.

Layer 46 prevents damage to the electronic components in the IC by substantially alleviating the aobe-described mechanical stress that would otherwise act on body 28 and interconnection system 12 as a result of the packaging cooldown shrinkage and subsequent thermal cycling. Coating 48 holds the entire length of each wire 34 firmly in place down to its ball 36. Consequently, the amount of thermal fatigue experienced by wire 34 down to ball 36 is greatly lessened so as to markedly reduce the liklihood of wire breakage. The highest thermally produced stress occurs at the bases of balls 36 which, for the reasons given above, normally can tolerate the stress.

An important advantage of the present packaging technique is that the stress-relief material is simultaneously applied to many dice on a wafer. This is more economical than the above-mentioned prior art technique in which stress-relief layer 38 is formed separately on each die.

Figure 3A:
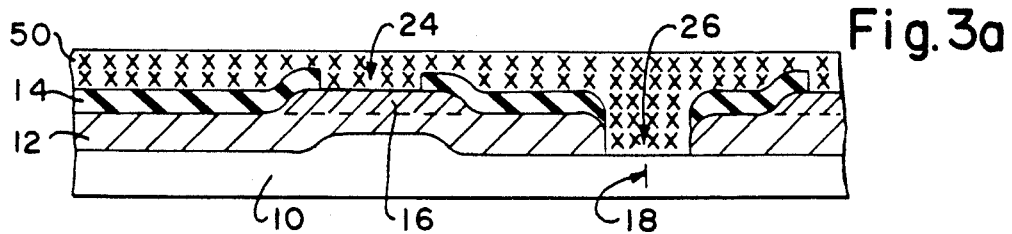
FIGS. 3a, 3b, and 3c are cross-sectional structural views illustrating alternative steps leading from the structure of FIG. 1c to the structure of FIG. 2c in accordance with the invention.
Figure 3B:
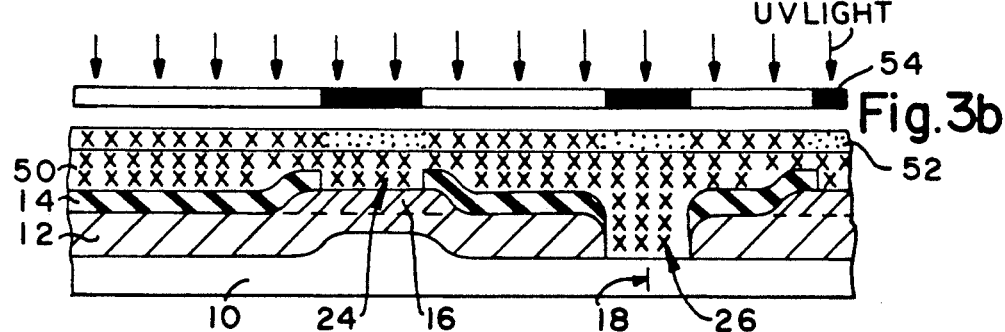
Figure 3C:
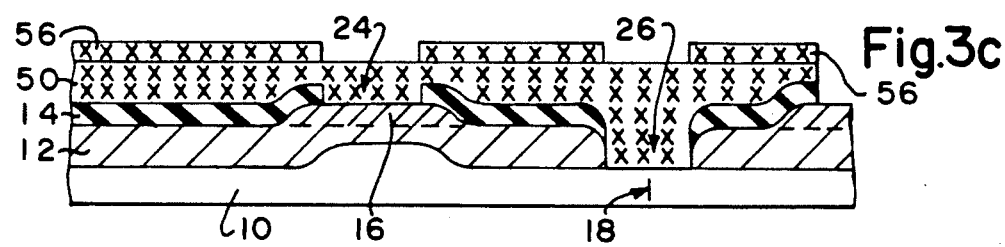

If the actinic material used in layer 42 is not well suited to a particular IC manufacturing process but a suitable non-actinic material is available, stress-relief layers 46 of the invention can be achieved by an alternative method whose critical features are depicted in FIGS. 3a-3c. The starting point is again FIG. 1c in which openings 24 and 26 have been etched through layer 14. In this case, a patternable layer 50 is formed on insulator 14 and in openings 24 and 26 as illustrated in FIG. 3a. Layer 50 consists of a transparent electrically insulating polymer of suitable $T_G$, as given above, for portions 46.

A blanket masking layer 52 of photoresist is formed on layer 50. See FIG. 3b. Care must be taken to assure that layers 50 and 52 do not significantly intermix. Layer 52 is selectively exposed to UV light through a radiation mask 54. The photoresist tone is, for example, negative. The foregoing comments about the features of mask 44 and the tone of layer 42 apply with essentially no change to mask 54 and layer 52.

Figure 2F:
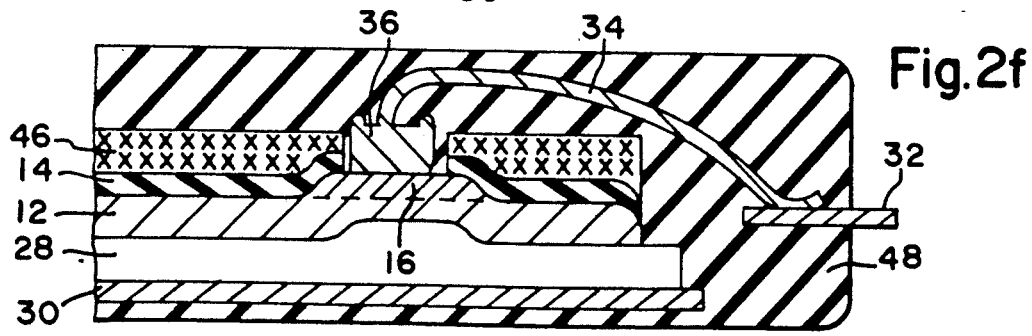

Photoresist layer 52 is developed to form openings generally aligned with openings 24 and 26 as shown in FIG. 3c. The remaining portions of layer 52 are indicated as patterned layer 56. Layer 50 is then etched throught the openings in layer 56 and to pad 16 and locations 18. Finally, layer 56 is removed to achieve the structure of FIG. 2c. Portions 46 are the remainder of layer 50 here. From this point, the steps of FIGS. 2d-2f are followed to complete the IC.

Figure 4A:
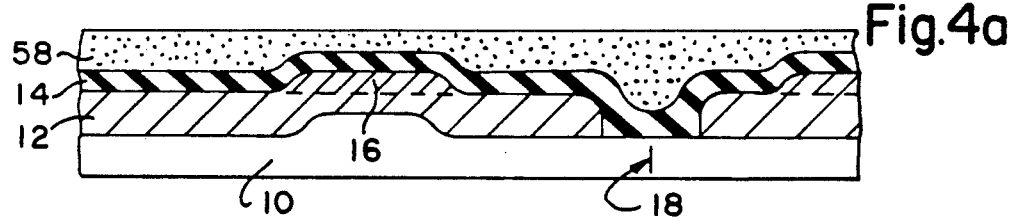
FIGS. 4a, 4b, and 4c are cross-sectional structural views illustrating alternative steps leading from the structure of FIG. 1a ot the structure of FIG. 2c according to the invention.
Figure 4B:
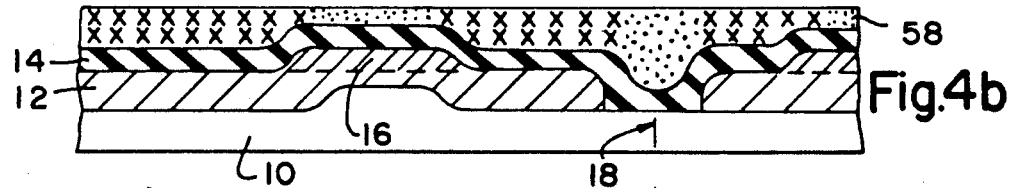
Figure 4C:
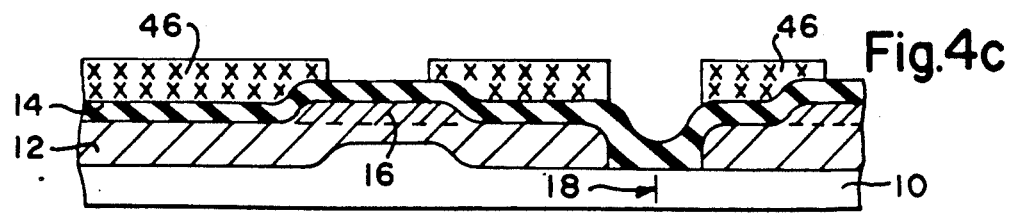

Turning to FIGS. 4a-4c, they illustrate the critical features in another method for producing stress-relief layers 46. In this alternative, portions 46 are employed as a mask in etching layer 14. The starting point for FIGS. 4a-4c is FIG. 1a in which the wafer has been processed up through the formation of insulator 14 on interconnection systems 12. A blanket patternable layer 58 of an electrically insulating actinic material is formed on layer 14 as shown in FIG. 4a. The material of layer 58 has all the characteristics given above for the material of layer 42.

Layer 58 is selectively exposed to actinic radiation through a radiation mask 60 as shown in FIG. 4b. If the actinic material is negative tone, mask 60 has blocking areas that prevent the radiation from impinging on portions of layer 58 lying above pad 16 and body 10 at locations 18. The reverse applies if the actinic material is positive tone.

For either tone, a suitable developer is employed to remove portions of layer 58 down to parts of insulator 14 lying on pad 16 and on body 10 at locations 18. See FIG. 4c. Portions 46 are the parts of layer 58 remaining after exposure and development. Layer 14 is then etched through the openings in and between portions 46, thereby again achieving the structure of FIG. 2c. The steps of FIGS. 2d-2f are subsequently followed to complete IC fabrication.

As with the process steps of FIGS. 2a and 2b, the process steps of FIGS. 4a and 4b can be modified along the lines indicated in FIGS. 3a-3c if an actinic material is unsuitable for some reason but a suitable non-actinic material is available. Starting with the structure of FIG. 1a, a patternable layer generally akin to layer 50 (in FIG. 3a) is formed on layer 14. A blanket photoresist masking layer is formed on the patternable layer and then processed in the same manner as layer 52 (in FIG. 3b) to produce a patterned photoresist layer which is used to etch openings through the patternable layer on insulator 14. The remaining photoresist may then removed to reach the structure of FIG. 4c, or layer 14 may be etched through the openings in and between portions 46 after which the remaining photoresist is removed to produce the structure of FIG. 2c.

Each of the last two variations saves a masking step compared to the corresponding process in which the material that forms portions 46 is deposited on layer 14 after openings 24 and 26 are etched through it. Some erosion of portions 46 may, however, occur during the etching of openings 24 and 26 in the last two variations. Care must be taken to assure that use of portions 46 as an etch mask does not lead to misalignment or missizing of openings 24 and 26.

While the invention has been described with reference to particular embodiments, this description is solely for the purpose of illustration and is not to be construed as limiting the scope of the invention claimed below. For example, the instant stress-relief layer can also be employed in discrete semiconductor devices. The package coating need not fully encapsulate the semiconductive body, interconnection system, overlying insulating layer, and stress-relief layer as long as it covers them on the top side. It might thus be possible to use the present stress-relief layer in a hybrid circuit. Accordingly, those skilled in the art may make various modifications, changes, and applications without departing from the true scope and spirit of the invention as defined by the appended claims.

We claim:

1. A semiconductor device in which an electrically insulating layer lies on an electrical interconnection system contacting a semiconductive body, openings extend through the insulating layer down to bond pads of the interconnection system, each pad is in contact with abonding portion of a different one of a set of electrical conductors that lead through the openings away from the interconnection system, and an electrically insulating coating covers the body, the interconnection system, the insulating layer, and the bonding portions such that a part of each conductor protrudes through the coating, characterized by a further layer that lies on the insulating layer under the coating but does not extend over the bonding portions, the further layer consisting substantially of a specified electrically insulating material that has a glass transition temperature $T_G$ below of 25° C. or less.

2. A device as in claim 1 characterized in that $T_G$ is −65° C. or less.

3. A device as in claim 1 characterized in that the specified material does not significantly decompose at a temperature less than or equal to 300° C.

4. A device as in claim 3 characterized in that the specified material is transparent.

5. A device as in claim 3 characterized in that the specified material consists substantially of exposed actinic material.

6. A device as in claim 3 characterized in that the specified material is a polymer consisting substantially of exposed photosensitive material.

7. A device as in claim 6 characterized in that the polymer is a silicone.

8. A device as in claim 1 characterized in that $T_G$ is less than the approximate temperature at which the thermal expansion coefficient of the coating starts to increase greatly in value.

9. A device as in claim 1 wherein the conductors respectively comprise wires that spread out into the bonding portions, the area at which each bonding portion contacts its pad being at least four times the cross-sectional area of the remainder of its wire, characterized in that the specified material is a transparent polymer which does not significantly decompose at a temperature less than or equal to 300° C.

10. A device as in claim 1 characterized in that the further layer fully laterally surrounds at least part of the bonding portion of at least one of the conductors.

11. A device as in claim 10 characterized in that $T_G$ is −65° C. or less.

12. A device as in claim 10 characterized in that the specified material does not significantly decompose at a temperature less than or equal to 300° C.

13. A device as in claim 12 characterized in that the specified material is a polymer consisting substantially of exposed photosensitive material.

14. A device as in claim 13 characterized in that the polymer is a silicone.

15. A device as in claim 10 wherein the composition of the insulating layer is substantially the same throughout the insulating layer, characterized in that the specified material is a silicone.

16. A device as in claim 15 characterized in that $T_G$ is −65° C. or less.

17. A device as in claim 15 characterized in that the specified material does not significatly decompose at a temperature less than or equal to 300° C.

18. A device as in claim 1 wherein the conductors respectively comprise wires that spread out into the bonding poritons, the area at which each bonding portion contacts its pad being at least four times the cross-sectional area of the remainder of its wire, characterized in that the further layer fully laterally surrounds at least part of the bonding portion of at least one of the conductors.

19. A device as in claim 18 characterized in that the specified material is a silicone.

20. A device as in claim 29 characterized in that the further layer has a thickness of 3-5 microns.

21. A device as in claim 1 characterized in that the further layer has a largely flat upper surface.

22. A device as in claim 21 characterized in that $T_G$ is −65° C. or less.

23. A device as in claim 22 characterized in that the specified material is a silicone polymer consisting substantially of exposed photosensitive material.

24. A device as in claim 21 characterized in that the further layer fully laterally surrounds at least part of the bonding portion of at least one of the conductors.

* * * * *